United States Patent
Westmarland et al.

(10) Patent No.: US 6,348,727 B1
(45) Date of Patent: Feb. 19, 2002

(54) HIGH CURRENT SEMICONDUCTOR DEVICE PACKAGE WITH PLASTIC HOUSING AND CONDUCTIVE TAB

(75) Inventors: Paul C. Westmarland; Peter R. Ewer, both of Surrey (GB); Alberto Guerra, Palos Verdes Estates, CA (US)

(73) Assignee: International Rectifier Corporation, CA (US)

( * ) Notice: Subject to any disclaimer, the term of this patent is extended or adjusted under 35 U.S.C. 154(b) by 0 days.

(21) Appl. No.: 09/455,699

(22) Filed: Dec. 7, 1999

Related U.S. Application Data
(60) Provisional application No. 60/112,326, filed on Dec. 15, 1998.

(51) Int. Cl.[7] .................. H01L 23/495; H01L 23/48; H01L 23/52; H01L 23/34; H01L 23/04
(52) U.S. Cl. .................. 257/675; 257/676; 257/692; 257/713; 257/730; 257/796; 257/732
(58) Field of Search ................... 257/675, 676, 257/692, 713, 730, 796, 732

(56) References Cited

U.S. PATENT DOCUMENTS

| | | | |
|---|---|---|---|
| 3,893,161 A | * | 7/1975 | Pesak, Jr. |
| 4,259,685 A | * | 3/1981 | Romano |
| 5,661,342 A | * | 8/1997 | Kawamodo |

* cited by examiner

Primary Examiner—David E. Graybill
(74) Attorney, Agent, or Firm—Ostrolenk, Faber, Gerb & Soffen, LLP

(57) ABSTRACT

A very high power semiconductor device package has a heavy flat conductive terminal which carries a semiconductor die. A thin conductive tab is disposed to be continuous with but insulated from the terminal and lies in a plane above the heavy flat terminal. A top electrode of the die is connected to the tab and an insulation housing encloses portions of the adjacent ends of the tab and terminal as well as the die and its connector leads. The free end of the tab may have printed circuit connection fingers. Two notches are cut into the sides of the thin tab at a location closely spaced from the surface of the housing through which the tab extends to provide stress relief for the insulation housing through which the tab extends.

18 Claims, 5 Drawing Sheets

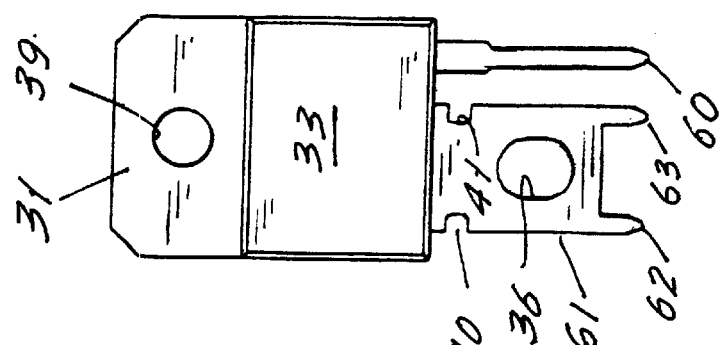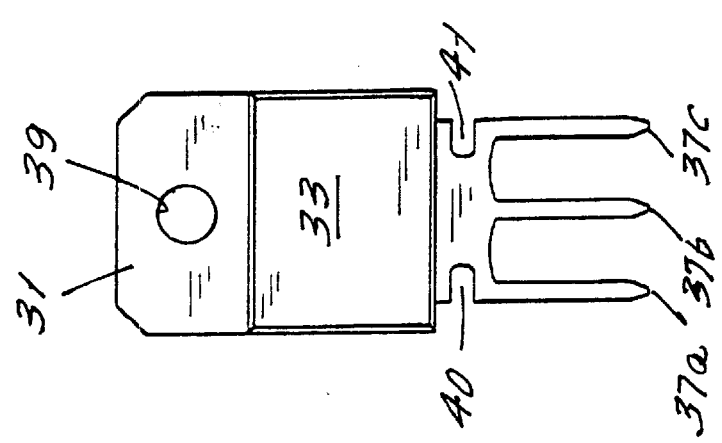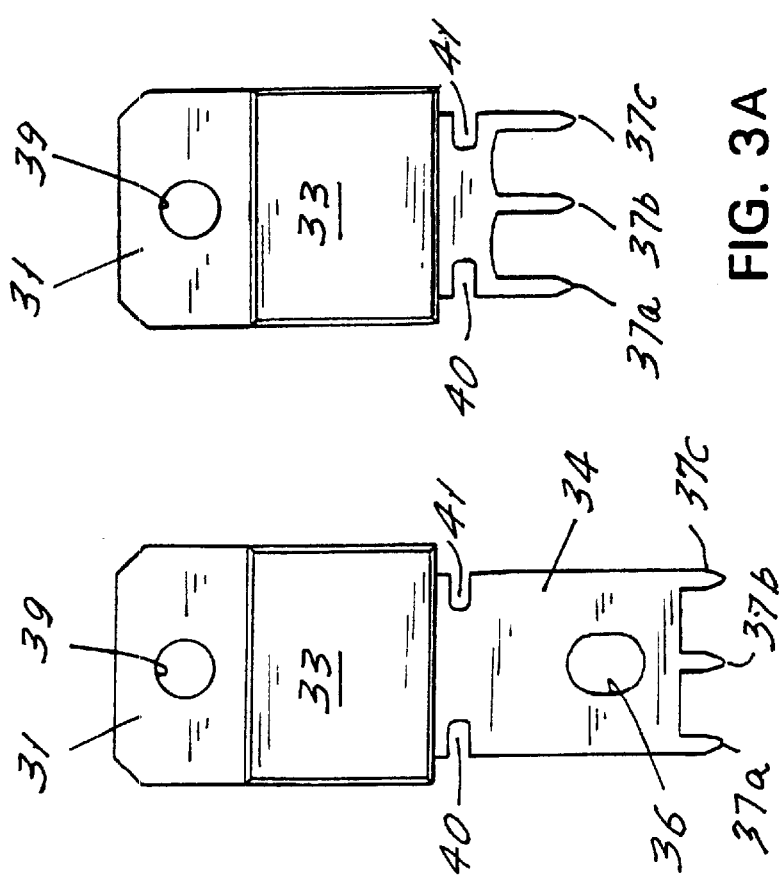

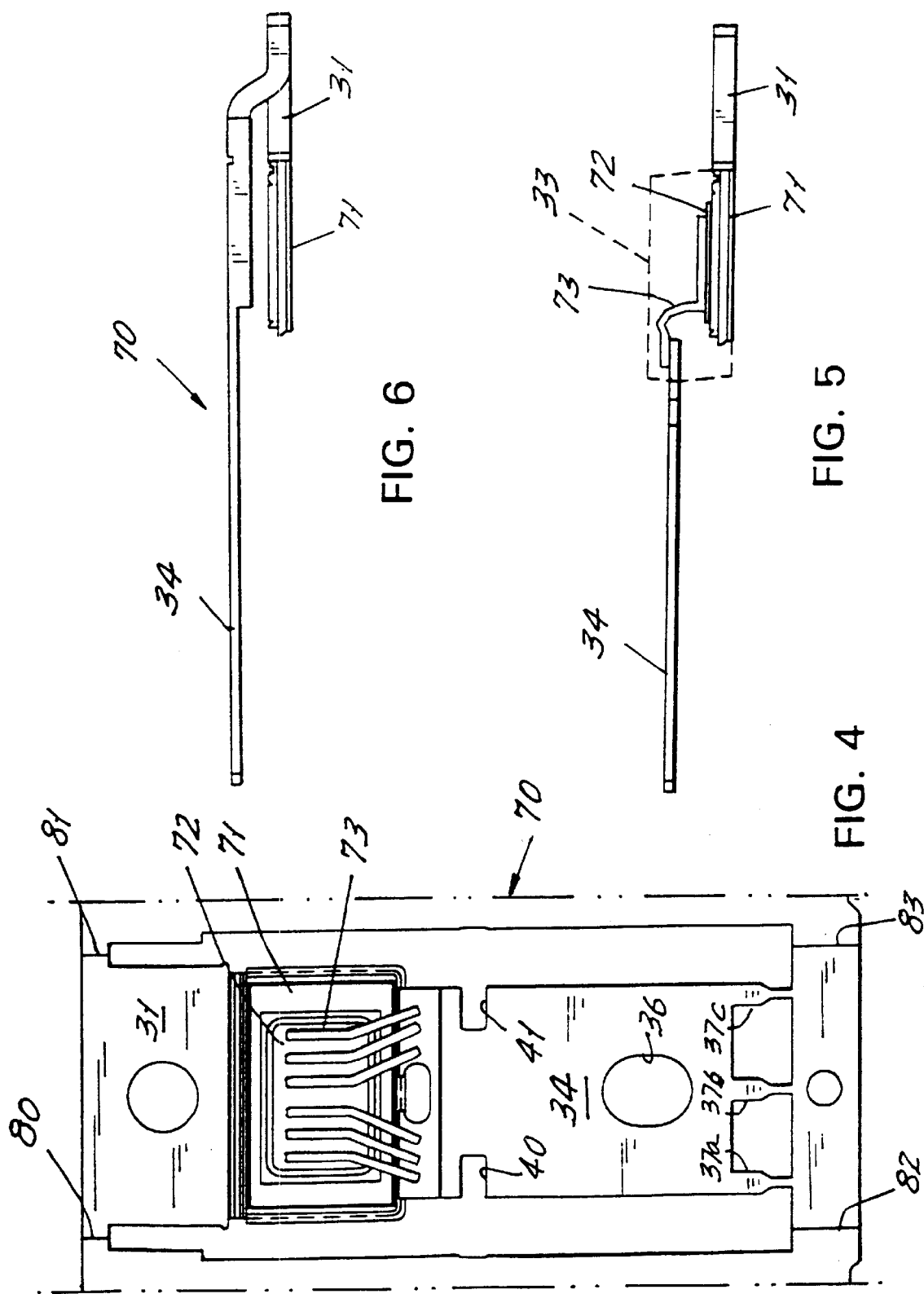

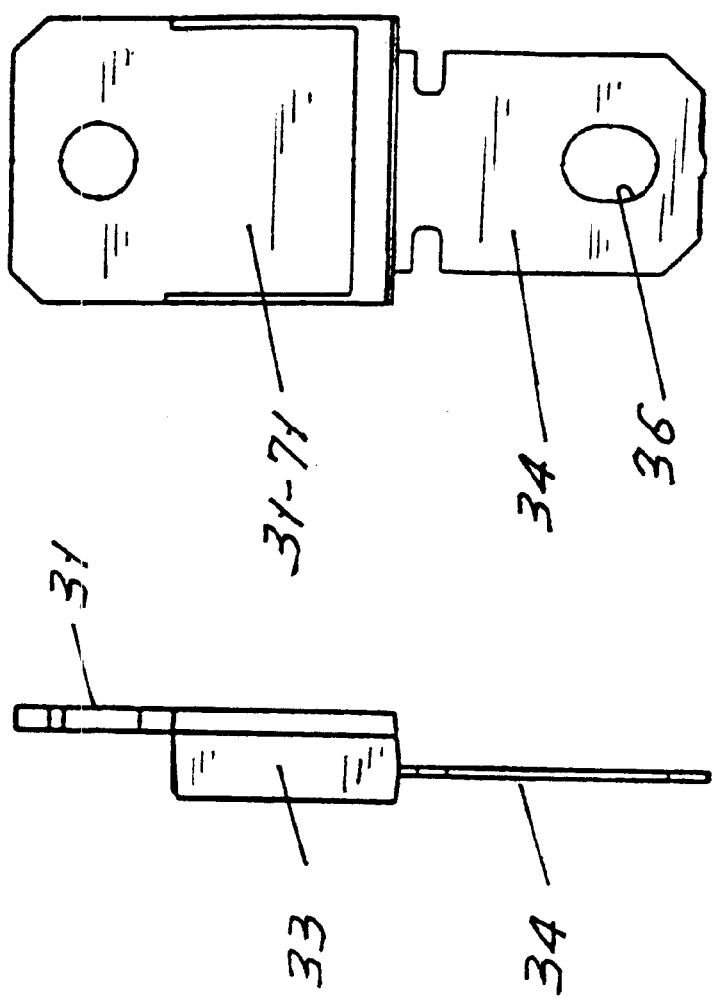
FIG. 9
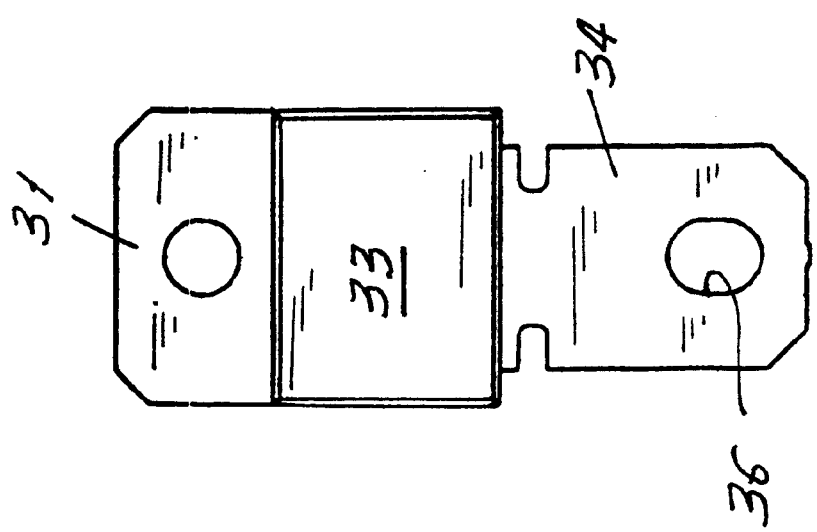
FIG. 8
FIG. 7

HIGH CURRENT SEMICONDUCTOR DEVICE PACKAGE WITH PLASTIC HOUSING AND CONDUCTIVE TAB

CROSS REFERENCE TO RELATED APPLICATION

This application is based on and claims priority to U.S. Provisional Patent Application No. 60/112,326, filed Dec. 15, 1998, the entire disclosure of which is hereby incorporated by reference.

BACKGROUND OF THE INVENTION

This invention relates to semiconductor device packages and more specifically relates to a novel package having a plastic housing and a conductive tab.

Discrete semiconductor devices such as diodes are available for high current applications in a variety of package styles. For example, a standard package known as a TQ–247 package is available at low cost for high current application while higher current devices are generally housed in more expensive metal cases or in power modules. There is a need for a high current package of lower cost than the metal package or module and a low cost package of higher current capacity than the TQ–247. In particular, a need exists for a low cost package for Schottky diodes with a rated voltage of about 45 volts and rated current of 100 to 175 amperes. Similarly, a need exists for such packages for fast recovery diodes and standard rectifiers having reverse voltages up to about 1200 volts or higher and forward currents of 70 to 85 amperes.

BRIEF DESCRIPTION OF THE INVENTION

In accordance with the present invention, a novel device package is provided in which a lead frame has a heat sink portion for receiving one or more die and an oppositely extending thin flat tab in a plane displaced from the plane of the heat sink. The heat sink portion and die mounted thereon is encapsulated in plastic with the heat sink having an extension through one wall of the plastic housing and the thin flat tab extends from an opposite end wall of the housing. Significantly, the thin tab has a pair of slots closely spaced from the housing wall to limit the transfer of stress from the tab to the housing which might chip or crack the housing.

The novel package provides a sturdy low cost high current device with a low profile and an excellent die-to-footprint ratio. The thin extending exposed tab provides an optimum connection of high-current capability and efficient heat sinking. The tab may also contain printed circuit board (PCB) insertion fingers so that the power density of existing circuits can be easily increased with little or no printed circuit board changes. The package also features large creepage distance, low internal resistance, and low stray inductance, ensuring optimum performance in high and low voltage applications.

BRIEF DESCRIPTION OF THE DRAWINGS

FIG. 2 is a top view of the package of FIG. 1.

FIGS. 3A to 3C show top views of other packages which can be made in accordance with the present invention.

FIG. 4 is a top view of the lead frame of the embodiment of FIG. 1, with a Schottky diode die bonded to the lead frame.

FIG. 5 is a side view of the lead frame and die of FIG. 4.

FIG. 6 is a side view of the lead frame of FIGS. 4 and 5 before connection of the die and separation of lead frame portions.

FIGS. 7, 8 and 9 are top, side and bottom views respectively of a further embodiment of the invention.

DETAILED DESCRIPTION OF THE DRAWINGS

Figure 1:
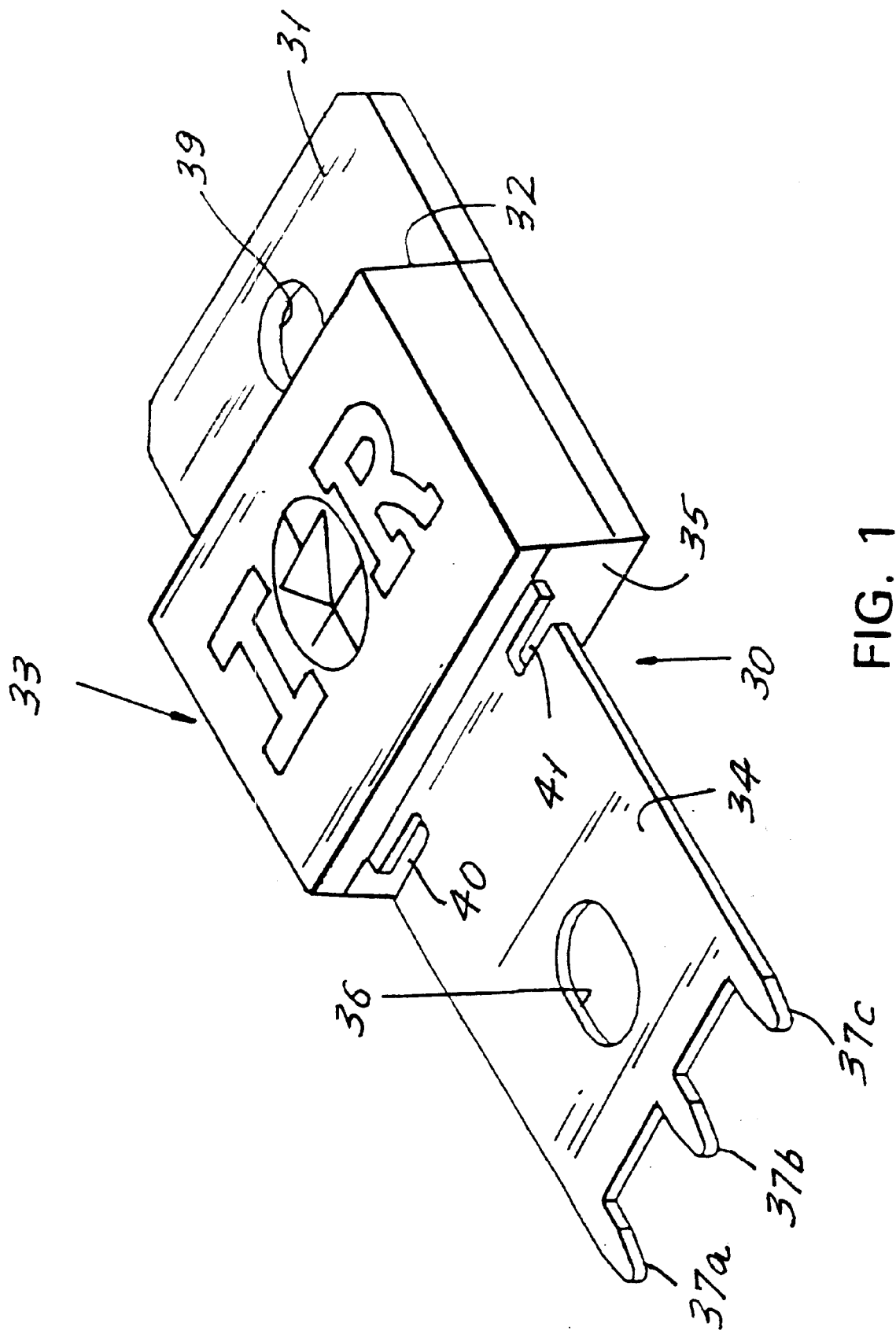
FIG. 1 is a perspective diagram of the package device of a preferred embodiment of the present invention.
Figure 10:
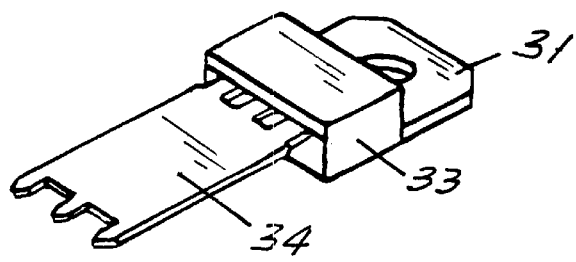
FIGS. 10 to 15 show further embodiments of the invention.
Figure 11:
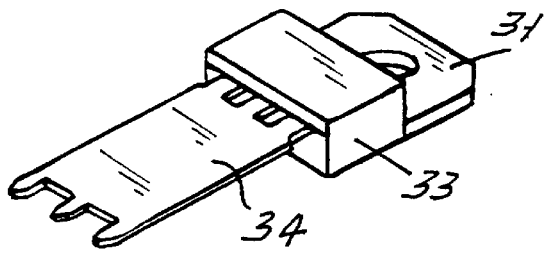
Figure 12:
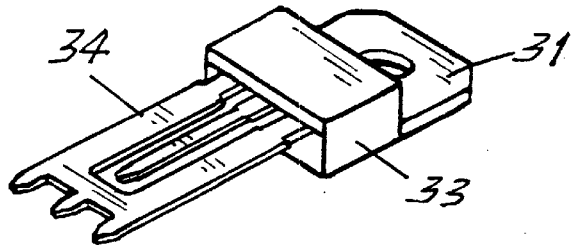
Figure 13:
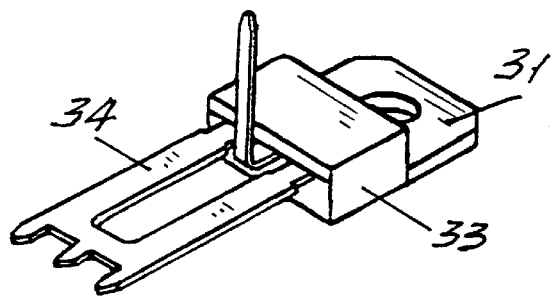
Figure 14:
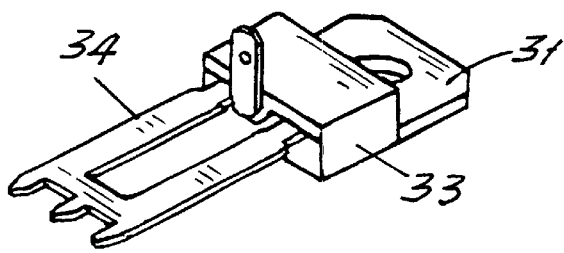

Referring first to FIGS. 1 and 2, there is shown the package 30 of the invention having a heavy bottom conductive terminal 31 extending beyond the side 32 of transfer molded insulation housing 33. A second electrode 34 of flat tab form extends from side 35 of housing 33, which is opposite from and parallel to side 32. Tab 34 is almost as wide as housing side 35 and has a mounting opening 36 therein and printed circuit board insertion fingers 37a, 37b and 37c at its outer free end. The electrodes 31 and 34 are connected to the top and bottom respectively of a semiconductor die, to be described, which is contained within housing 33. This die may be any desired semiconductor device, for example, a Schottky diode or any other two terminal device. However, as will be described, the die may also have a control electrode, for example, power MOSFET die, in which case a control electrode also extends from housing 33. Terminal 31 has a mounting opening 39 therein.

As a significant feature of tab 34, are two opposing stress relief notches 40 and 41 closely adjacent to plastic housing 33 which reduce the transmission of stress from tab 34 to the plastic housing 33.

The package of FIGS. 1 and 2 may be modified in shape, as shown in FIGS. 3A, 3B and 3C. Elements similar to those in FIGS. 3A, 3B and 3C have similar identifying numerals. Thus, in the package of FIG. 3A, tab 34 is foreshortened; and the tab 34 in FIG. 3B has elongated plug-in fingers 37a, 37b and 37c. The package of FIG. 3C shows the provision of a control electrode finger 60 which may be internally connected to a gate electrode of a MOSFET die within housing 33 while the tab portion 61 is a source electrode with plug-in fingers 62 and 63. Tab 31 in FIG. 3C is connected to the bottom drain electrode of the MOSFET die within housing 33.

FIGS. 4, 5 and 6 show the details of the lead frame and semiconductor die for the embodiment of FIGS. 1 and 2. Thus, lead frame 70 of FIGS. 4 and 6 provides the terminal 31 and tab 34. The heavier section of lead frame 70 has an integrally extending die receiving portion 71 which, in FIGS. 4 and 5 receives the bottom electrode of a semiconductor die 72 as by soldering, or otherwise electrically connected thereto. Die 72 may be a schottky diode die. Its upper electrode is connected by six stitch wire bonds 73 to the tab portion 34. Plastic housing 33 is then formed as shown in dotted lines in FIG. 5, and the lead frame is severed at lines 80 to 84 to separate the thick sections 31–71 and tab 34.

FIGS. 7, 8 and 9 show top, side and bottom views respectively of a still further embodiment of a device in which tab 34 is not provided with plug-in contacts, but is connected by bolts through opening 36.

Figure 15:
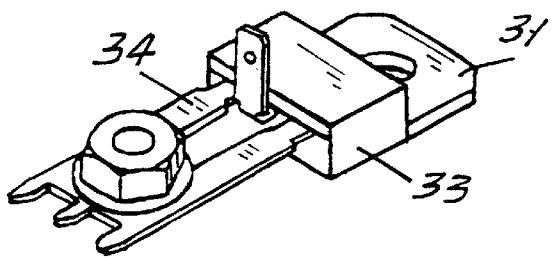

As pointed out previously, there are a number of options for the ultimate package. Some options are shown in FIGS. 10 to 15. Thus, FIGS. 12 to 15 show devices with central control electrodes 50 which are insulated from tab 37. FIG. 15 shows an optimal structure for tab 34 which enables connection by a bolt 51.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high power semiconductor device comprising a relatively thick flat conductive bottom terminal disposed in a first plane, at least one semiconductor die having its bottom surface supported on and electrically connected to the upper surface of said bottom terminal; a flat tab which is relatively thin compared to said bottom terminal; said flat tab disposed in a plane parallel to and displaced above said plane of said bottom terminal and being electrically insulated therefrom; the width of said tab being substantially equal to the width of said bottom terminal; said tab being longitudinally displaced from at least a portion of the body of said bottom terminal; connector means connecting the top surface of said die to said conductive tab; and an insulation housing molded around and enclosing the top of said die, said connector means, only a first portion of said tab which is adjacent said bottom conductive terminal and at least a portion of said bottom conductive terminal, whereby said bottom conductive terminal and said tab form external terminals for said die.

2. The device of claim 1 wherein said tab has first and second stress relief notches in its opposite sides at locations adjacent to the side surface of said insulation housing which is molded around said first portion of said tab to reduce the transmission of stress from said tab to said housing.

3. The device of claim 1 wherein a portion of said bottom terminal extends beyond said housing, a central portion of said portion of said bottom terminal and a central portion of said tab which extends beyond said housing each having respective openings therethrough.

4. The device of claim 2 wherein a portion of said bottom terminal extends beyond said housing, a central portion of said portion of said bottom terminal and a central portion of said tab which extends beyond said housing each having respective openings therethrough.

5. The device of claim 1 wherein the free end of said tab has a plurality of plug-in insertion fingers extending therefrom.

6. The device of claim 3 wherein the free end of said tab has a plurality of plug-in insertion fingers extending therefrom.

7. The device of claim 4 wherein the free end of said tab has a plurality of plug-in insertion fingers extending therefrom.

8. The device of claim 1 wherein said die is a device selected from the group consisting of diodes, MOSgated devices and thyristors.

9. The device of claim 1 wherein said tab has a co planar laterally displaced contact finger extending therewith and insulated from said tab and said bottom terminal; said die comprising a MoSgated device having a gate electrode on its top surface; and second connector means disposed within said housing electrically connecting said gate electrode to said contact finger.

10. The device of claim 2 wherein said tab has a coplanar laterally displaced contact finger extending therewith and insulated from said tab and said bottom terminal; said die comprising a MOSgated device having a gate electrode on its top surface; and second connector means disposed within said housing electrically connecting said gate electrode to said contact finger.

11. The device of claim 3 wherein said tab has a coplanar laterally displaced contact finger extending therewith and insulated from said tab and said bottom terminal; said die comprising a MOSgated device having a gate electrode on its top surface; and second connector means disposed within said housing electrically connecting said gate electrode to said contact finger.

12. The device of claim 4 wherein said tab has a coplanar laterally displaced contact finger extending therewith and insulated from said tab and said bottom terminal; said die comprising a MOSgated device having a gate electrode on its top surface; and second connector means disposed within said housing electrically connecting said gate electrode to said contact finger.

13. The device of claim 1 wherein said die is a diode.
14. The device of claim 2 wherein said die is a diode.
15. The device of claim 3 wherein said die is a diode.
16. The device of claim 4 wherein said die is a diode.
17. The device of claim 5 wherein said die is a diode.
18. The device of claim 7 wherein said die is a diode.

* * * * *